United States Patent
Latrasse et al.

(10) Patent No.: US 10,103,006 B2
(45) Date of Patent: Oct. 16, 2018

(54) ELEMENTARY DEVICE FOR APPLYING A MICROWAVE ENERGY WITH A COAXIAL APPLICATOR

(71) Applicant: SAIREM SOCIETE POUR L'APPLICATION INDUSTRIELLE DE LA RECHERCHE EN ELECTRONIQUE ET MICRO ONDES, Miribel (FR)

(72) Inventors: Louis Latrasse, Dommartin (FR); Marilena Radoiu, Rillieux-la-Pape (FR)

(73) Assignee: SAIREM SOCIETE POUR L'APPLICATION INDUSTRIELLE DE LA RECHERCHE EN ELECTRONIQUE ET MICRO ONDES, Miribel (FR)

( * ) Notice: Subject to any disclaimer, the term of this patent is extended or adjusted under 35 U.S.C. 154(b) by 0 days.

(21) Appl. No.: 15/946,156

(22) Filed: Apr. 5, 2018

(65) Prior Publication Data

US 2018/0233332 A1    Aug. 16, 2018

Related U.S. Application Data

(63) Continuation of application No. PCT/FR2016/052545, filed on Oct. 4, 2016.

(30) Foreign Application Priority Data

Oct. 5, 2015    (FR) ...................................... 15 59458

(51) Int. Cl.
| H01J 37/32 | (2006.01) |
| H05B 6/70 | (2006.01) |
| H05B 6/80 | (2006.01) |

(52) U.S. Cl.
CPC ........ *H01J 37/32229* (2013.01); *H05B 6/702* (2013.01); *H05B 6/80* (2013.01)

(58) Field of Classification Search
CPC ........................... H01J 37/32229; H05B 6/702
See application file for complete search history.

(56) References Cited

U.S. PATENT DOCUMENTS

| 4,261,630 A | 4/1981 | Knappenberger |
| 7,946,886 B1 | 5/2011 | Liu |
| (Continued) | | |

FOREIGN PATENT DOCUMENTS

| FR | 2955451 | 7/2011 |
| WO | 2012/146870 | 11/2012 |
| WO | 2014/184357 | 11/2014 |

OTHER PUBLICATIONS

International Search Report for International Application PCT/FR2016/052545, dated Dec. 20, 2016.

*Primary Examiner* — Douglas W Owens
*Assistant Examiner* — Pedro C Fernandez
(74) *Attorney, Agent, or Firm* — Burris Law, PLLC

(57) ABSTRACT

An elementary device of the present disclosure includes a coaxial applicator that includes a connector disposed at a distal end of the applicator, a shielding, a microwave energy propagation medium disposed between a central core and the shielding, and an insulating body disposed at a proximal end of the applicator. The shielding surrounds the central core and has a bottom wall provided at the distal end. The connector includes an external conductor connected to the shielding and an internal conductor connected to the central core. The connector is disposed at the bottom wall with the external conductor fixed to the bottom wall and the internal conductor linked to a connecting element that extends through the bottom wall and parallel to the main axis with a predefined spacing provided between the central core and (Continued)

a free end connected to the central core at a predefined distance from the bottom wall.

7 Claims, 5 Drawing Sheets

(56) References Cited

U.S. PATENT DOCUMENTS

| | | |
|---|---|---|
| 2010/0171425 A1 | 7/2010 | Gesche et al. |
| 2013/0157505 A1* | 6/2013 | Sykes .................... H01R 9/05 439/578 |
| 2015/0214011 A1* | 7/2015 | Kaneko .................. H05H 1/46 315/111.21 |
| 2018/0108515 A1* | 4/2018 | Iwasaki ................ C23C 16/511 |

* cited by examiner

ELEMENTARY DEVICE FOR APPLYING A MICROWAVE ENERGY WITH A COAXIAL APPLICATOR

CROSS-REFERENCE TO RELATED APPLICATIONS

This application is a continuation of International Application No. PCT/FR2016/052545, filed on Oct. 4, 2016, which claims priority to and the benefit of FR 15/59458 filed on Oct. 5, 2015. The disclosures of the above applications are incorporated herein by reference.

FIELD

The present disclosure relates to an elementary device for applying a microwave energy, and to a microwave treatment installation of a load using at least such an elementary device. It relates more specifically to an elementary device comprising a coaxial microwave power applicator.

BACKGROUND

The statements in this section merely provide background information related to the present disclosure and may not constitute prior art.

The present disclosure relates to the field of microwave treatment of a load, where the load may be of the solid type (e.g., granular or powder type), gas, plasma, liquid (with a solvent and/or solutes absorbing the electromagnetic radiation). It should be noted that the microwave energy concerns the waves whose frequency is comprised between about 300 MHz and about 30 GHz, preferably between 400 MHz and 10 GHz, and preferably between 915 MHz and 5.8 GHz.

The present disclosure also relates to the field of heat treatment of a reactive medium, where "heat treatment" is directed toward various treatments carried out by heating, such as evaporation, drying, roasting, extraction of natural products suspended in a solvent, chemical reaction or synthesis with heating by dielectric losses (for analyzing or producing chemical compounds), dehydration, baking, bleaching, separation, polymerization, crosslinking, supercritical fluid treatments, removal of volatile compounds etc. as well as various treatments performed simultaneously with the heating, such as mixing or grinding.

The present disclosure further relates to the field of plasma production inside a confinement chamber, for various applications such as, for example, surface cleaning, sterilization, deposition, in particular plasma-enhanced chemical vapor deposition, etching, ion implantation, surface functionalization and other surface treatments such as ion beam sputtering (or cathode sputtering).

To transmit microwave energy between a generator and the inside of the chamber, it is necessary to use at least one elementary device for applying microwave energy, and generally a plurality of such elementary devices in association, which are often called elementary sources.

It is thus known from the documents WO 2014/184357 and WO 2012/146870 to use an elementary device for applying a microwave energy, which comprises a coaxial microwave power applicator.

Referring to FIGS. 1(a) and 1(b), a conventional elementary device 10 includes a coaxial microwave power applicator 100 that allows transmitting the microwave energy coming from a microwave energy generator (not shown) to a chamber 4 delimited by a partition 40 (illustrated in FIG. 1(b)).

Such a coaxial applicator 100 includes a central conductive core 101 extending along a main axis 1010, a conductive outer shield 102 surrounding the central core 101, and a medium 103 for propagating a microwave energy located between the central core 101 and the shield 102.

This coaxial applicator 100 has a distal end 104 provided with a coaxial structure connector 105 provided for the coupling with the generator and an opposite proximal end 106 provided to emerge (i.e., extend) inside the chamber 4, this proximal end 106 being provided with an insulating body 107 made of dielectric material transparent to microwave energy.

In addition, the shield 102 has a peripheral wall 1020 surrounding the central core 101 and a bottom wall 1021 provided on the distal end 104 and extending transversely to the main axis 1010.

As known, the coaxial structure connector 105 is provided with an outer conductor 108 connected to the shield 102 and surrounding an inner conductor 109 connected to the central core 101. This coaxial structure connector 105 is conventionally disposed on the peripheral wall 1020 of the shield 102 at a predefined distance relative to the bottom wall 1021 in the order of quarter-wave (namely a quarter of the wavelength of the microwave energy) to promote the transmission of energy to the coaxial applicator 100 without generating reflected power. The inner conductor 109 passes through the peripheral wall 1020 of the shield 102 and extends in a direction orthogonal to the main axis 1010 to come into contact with the central core 101 at a distance D relative to the bottom wall 1021 in the order of quarter-wave.

One possible concern with the elementary device 10 is its lateral or peripheral bulk induced by the presence of the coaxial structure connector 105 on the peripheral wall 1020 of the shield 102.

In some applications, it is necessary to have several elementary devices mounted side by side on the partition of the chamber and connected to coaxial cables or guides. However, the coaxial structure connectors 105 of these elementary devices 10 can inhibit placing the elementary devices 10 in close proximity to each other, particularly when the receiving surface on the partition is restricted.

Furthermore, this peripheral positioning of the coaxial structure connector 105 can hinder the placement of the coaxial cable or the guide that may be bent in order to connect to the coaxial structure connector 105. Such a bending of the coaxial cable or the guide is not possible when the elementary devices 10 are close to each other, and thus, it becomes necessary to connect the coaxial cables or the guides at the coaxial structure connectors 105 via coaxial right-angle bends, thus complicating the mounting.

SUMMARY

The present disclosure is directed toward an elementary device for applying a microwave energy. The elementary device comprises a coaxial microwave power applicator having a distal end and a proximal end opposite of the distal end and configured to extend inside a chamber. The coaxial microwave power applicator comprises a coaxial structure connector disposed at the distal end and configured to couple to a coaxial cable or guide connected to a microwave energy generator. The coaxial applicator further comprising: a central conductive core extending along a main axis; an outer conductive shield having a peripheral wall surrounding the central core and a bottom wall provided on the distal end and extending transversely to the main axis; a medium for propagating the microwave energy located between the central core and the shield; and an insulating body made of dielectric material, transparent to microwave energy and disposed at the proximal end. The coaxial structure connector is provided with an outer conductor connected to the shield and surrounding an inner conductor connected to the central core. The coaxial structure connector is disposed at the bottom wall of the shield having the outer conductor fastened to the bottom wall and the inner conductor connected to an elongate connecting element that passes through the bottom wall and extends, from the bottom wall, substantially parallel to the main axis with a predefined spacing relative to the central core up to a free end connected to this central core at a predefined distance from the bottom wall.

Thus, the coaxial structure connector is placed at the bottom wall of the shield and its coaxial axis is substantially parallel to the main axis of the coaxial applicator. Accordingly, the coaxial structure connector inhibits or reduces lateral bulk. In addition, the coaxial cable or guide is configured to plug directly to the coaxial structure connector, thus inhibiting the use of a coaxial right-angle bend or a bend on the coaxial cable or guide, and to provide a compact implantation of the elementary devices and the associated coaxial cables or guides on the partition of a chamber.

In one form, the coaxial structure connector is connected directly to the generator through the coaxial guide or cable. In another form, one or more device(s), such as a power divider or an adapter, are placed between the coaxial structure connector and the generator.

In one form, the central core supports a connecting member which is in contact with the free end of the connecting element at the predefined distance from the bottom wall.

In another form, the connecting member is fastened on the free end of the connecting element by at least one of a screw, a weld, or a crimp.

In one form, the connecting member is welded too the central core.

In another form, the connecting element has: an initial cylindrical portion of reduced diameter connected to the inner conductor of the coaxial structure connector; an intermediate truncated-cone-shaped portion; and a final cylindrical portion of increased diameter that ends with the free end connected to the central core.

In a variant adapted to a frequency in the order of 915 MHZ, the final portion may be of curved shape, and the intermediate portion of non-specifically cylindrical shape.

According to one form of the present disclosure, the elementary device is for producing a plasma inside the chamber.

In another form, the present disclosure is directed toward a microwave treatment installation of a load, where the treatment installation comprises: a chamber in the volume of which the load is confined; at least one microwave energy generator; and at least one elementary device in accordance with the teaching of the present disclosure. The coaxial structure connector of the elementary device is connected to a coaxial cable or guide connected to the microwave energy generator and the proximal end of the coaxial applicator extends inside the chamber.

Further areas of applicability will become apparent from the description provided herein. It should be understood that the description and specific examples are intended for purposes of illustration only and are not intended to limit the scope of the present disclosure.

DRAWINGS

In order that the disclosure may be well understood, there will now be described various forms thereof, given by way of example, reference being made to the accompanying drawings, in which.

Figure 1A:
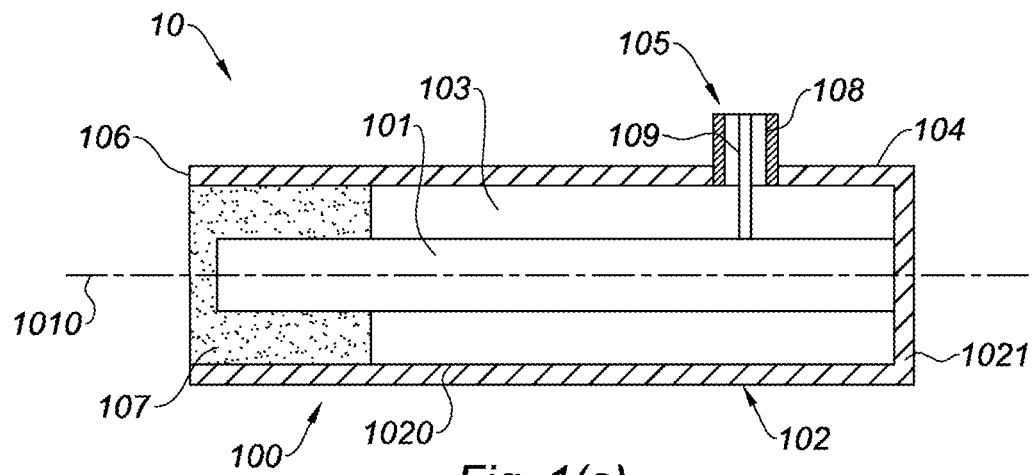
FIG. 1(a) is an axial cross-sectional schematic view of a conventional elementary device.
Figure 1B:
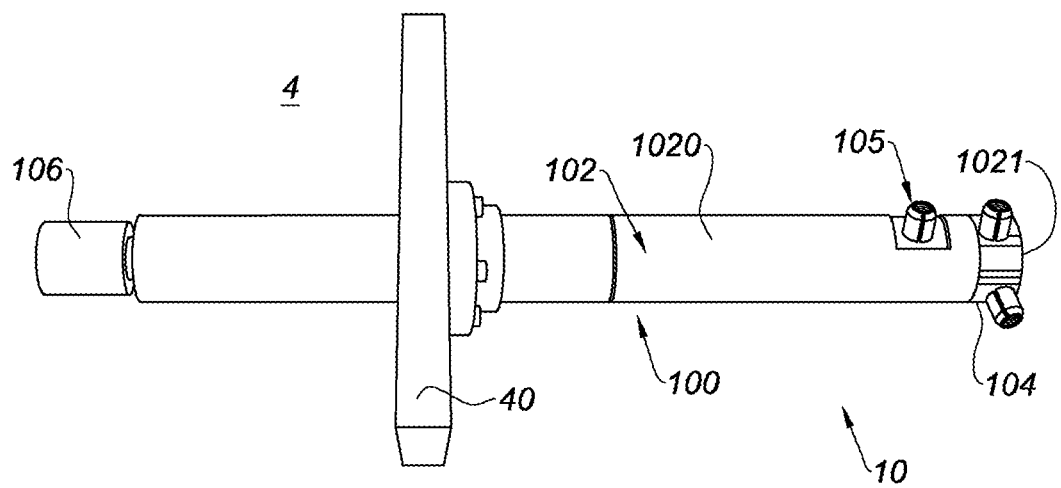
FIG. 1(b) is a schematic perspective view of another conventional elementary device.

The drawings described herein are for illustration purposes only and are not intended to limit the scope of the present disclosure in any way.

DETAILED DESCRIPTION

The following description is merely exemplary in nature and is not intended to limit the present disclosure, application, or uses. It should be understood that throughout the drawings, corresponding reference numerals indicate like or corresponding parts and features.

Figure 5:
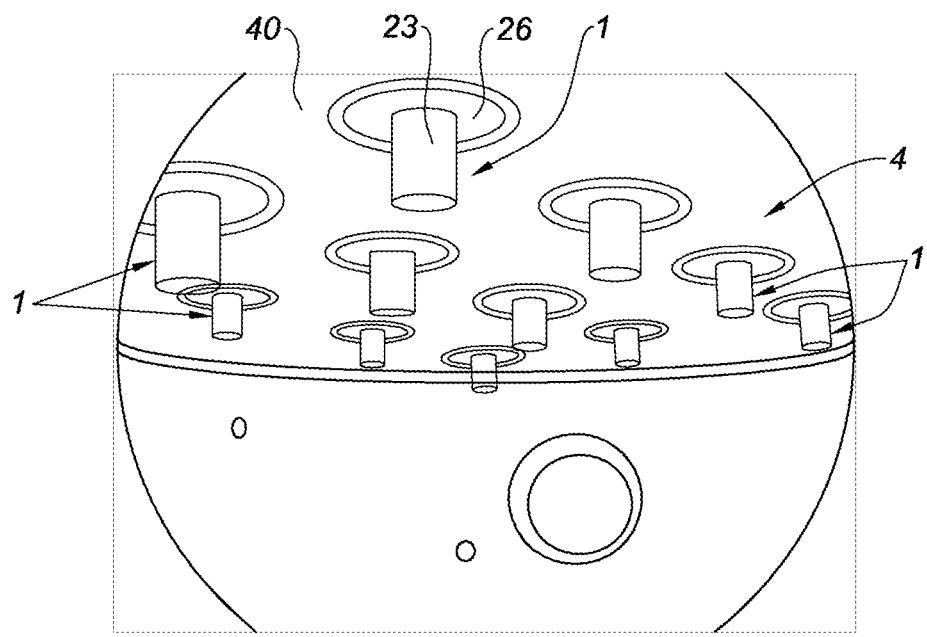
FIG. 5 is a schematic view of the inside of a plasma chamber wherein several first or second elementary devices of FIG. 4 are placed.
Figure 6:
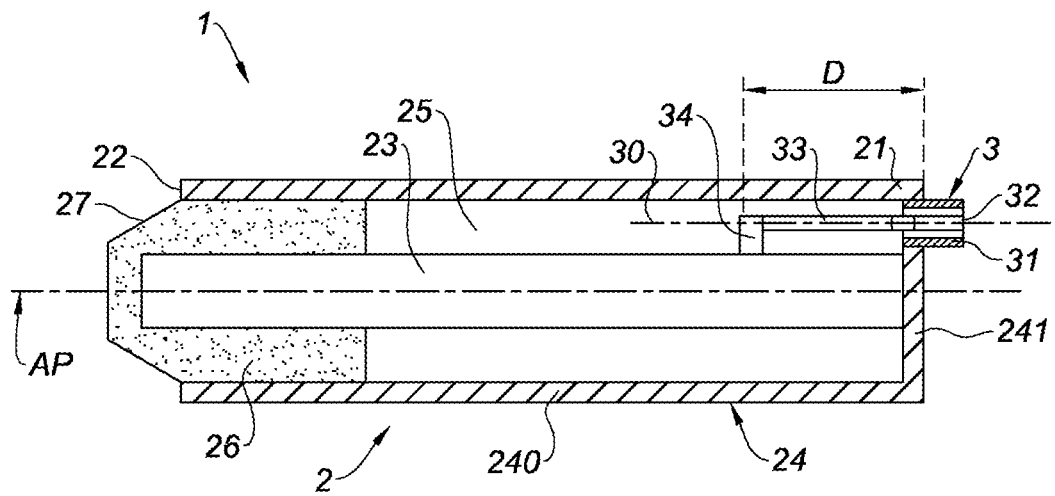
FIG. 6 is an axial cross-sectional schematic view of a third elementary device in accordance with the present disclosure.
Figure 7:
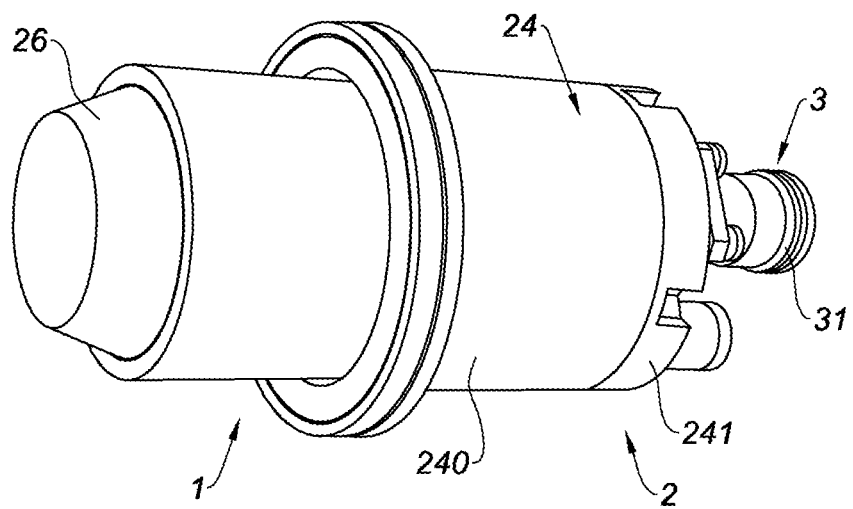
FIG. 7 is a schematic perspective view of the third elementary device of FIG. 6.
Figure 8:
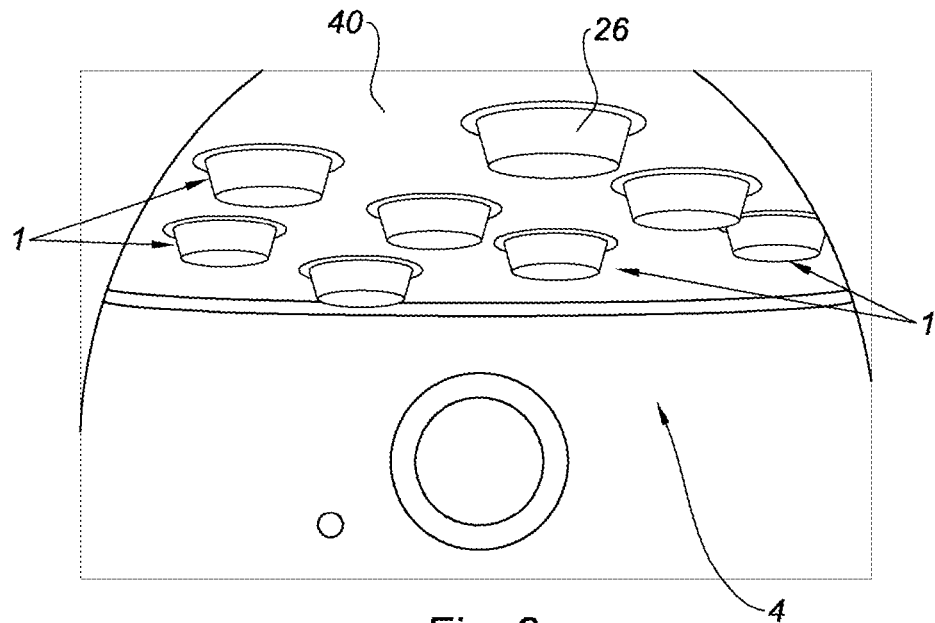
FIG. 8 is a schematic view of the inside of a plasma chamber wherein several third elementary devices of FIG. 7 are placed.

FIGS. 2 to 8 illustrate three forms of an elementary device 1 for producing a plasma, with a first form and a second form illustrated in FIGS. 2 to 5 and a third form illustrated in FIGS. 6 to 8 and, unless otherwise explicitly or implicitly stated, members, parts, devices or structurally or functionally identical or similar elements will be designated by identical marks in these figures.

The elementary device 1 comprises a coaxial microwave power applicator 2 to provide the transmission of a microwave energy between a microwave energy generator (not illustrated), in particular of the solid-state generator type, and the inside of a chamber 4 containing a load to be treated, in particular of the type plasma chamber (seen in FIGS. 5 and 8).

Figure 9:
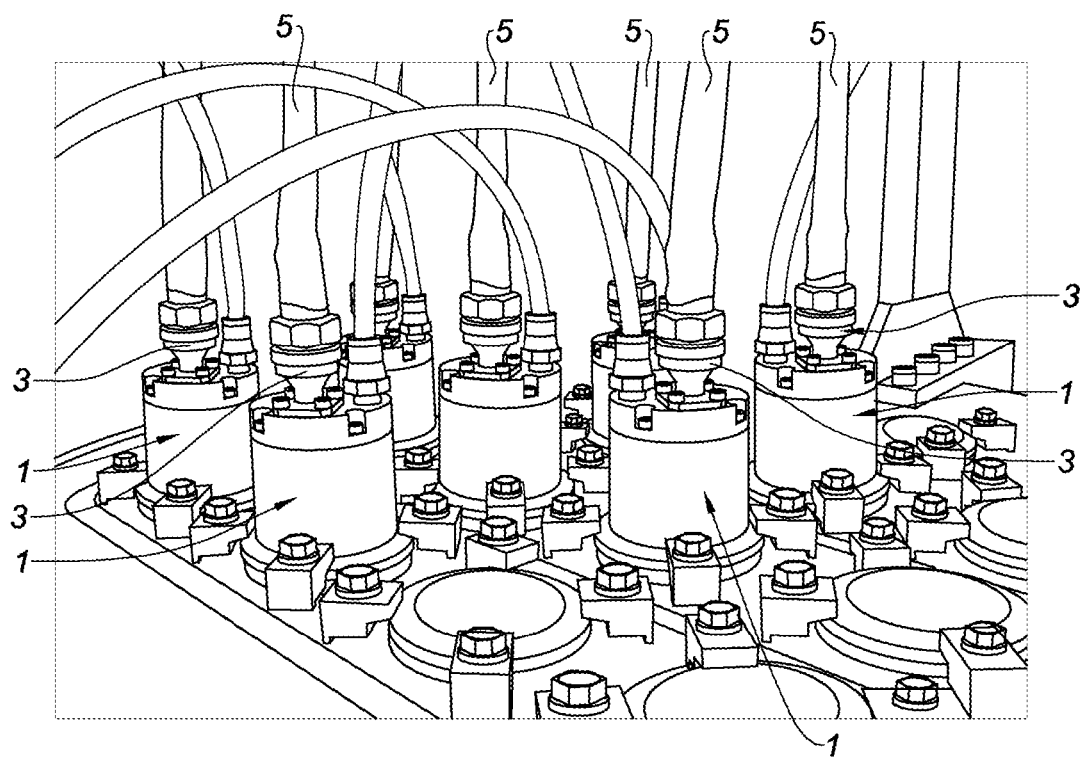
FIG. 9 is a schematic view of a chamber along the partition of which several elementary devices in accordance with the present disclosure are mounted, with visible coaxial cables connected to the different elementary devices.

This coaxial applicator 2 is made in a wire form to have an elongated form according to a main axis AP, and it has: a distal end 21 provided with a coaxial structure connector 3 provided for the coupling with a coaxial cable or guide 5 (shown in FIG. 9) connected to a microwave energy generator; and an opposite proximal end 22 provided to emerge inside the chamber 4.

The coaxial applicator 2 comprises: a conductive central core 23 extending along the main axis AP; an outer conductive shield 24 surrounding the central core 23, the outer shield 24 having the shape of a hollow sleeve comprising a peripheral wall 240 having a cylindrical inner face centered on the main axis AP, and a bottom wall 241 closing the distal end 21 of the coaxial applicator 2; a medium 25 for propagating the microwave energy located between the central core 23 and the shield 24, the propagation medium 25 being for example wholly or partly composed of air; and an insulating body 26 made of dielectric material transparent to the microwave energy, the insulating body 26 being disposed at the proximal end 22 of the coaxial applicator 2.

The bottom wall 241 may be fixedly attached to the peripheral wall 240 or may be integrally formed therewith.

The insulating body 26 completely plugs the proximal end 22 of the coaxial applicator 2, thereby separating the inside of the chamber 4 which is often maintained at low pressure, from the propagation medium 25 which is at ambient atmospheric pressure. The insulating body 26 has an outer surface 27 provided to be in contact with the inside of the chamber 4 and with a gas to be excited localized inside the chamber 4 in case of plasma application.

In the first and second forms of FIGS. 2 to 5, the outer surface 27 of the insulating body 26 is levelling with the proximal end of the shield 24, and therefore does not exceed the shield 24. In addition, the central core 23 completely passes through the insulating body 26 and protrudes outwardly therefrom.

In the third form of FIGS. 6 to 8, the outer surface 27 of the insulating body 26 protrudes outwardly from the proximal end of the shield 24. In addition, the central core 23 has a proximal end embedded within the insulating body 26, without completely passing through this insulating body 26.

In accordance with the present disclosure, the coaxial structure connector 3 is disposed at the bottom wall 241 of the shield 24, and has an outer conductor 31 connected to the bottom wall 241 of the shield 24 and surrounding an inner conductor 32 connected to the central core 23 of the coaxial applicator 2.

Fastening the coaxial structure connector 3 is improved by way, for example, screws provide at the bottom wall 241 of the shield 24, on the outer side. This coaxial structure connector 3 has a coaxial axis 30 parallel to the main axis AP of the coaxial applicator 2.

The inner conductor 32 is connected to the central core 23 by way of, for example, an elongate and conductive connecting element 33 that has an end connected to the inner conductor 32 and an opposite end, called free end, connected to the central core 23.

This connecting element 33 extends in the extension of the coaxial structure connector 3 and therefore extends along the coaxial axis 30, parallel to the main axis AP of the coaxial applicator 2.

The coaxial structure connector 3 is offset radially with respect to the main axis AP (in other words the coaxial axis 30 and the main axis AP are not collinear) such that the connecting element 33 extends substantially parallel to the main axis AP with a predefined space relative to the central core 23 up to its free end. The connecting element 33 passes through the bottom wall 241 of the shield 24.

The central core 23 supports a connecting member 34 which is welded onto the central core at a predefined distance D from the bottom wall 241 of the shield 24.

This connecting member 34 is in contact with the free end of the connecting element 33, and is fastened to the free end of the connecting element 33.

Figure 2:
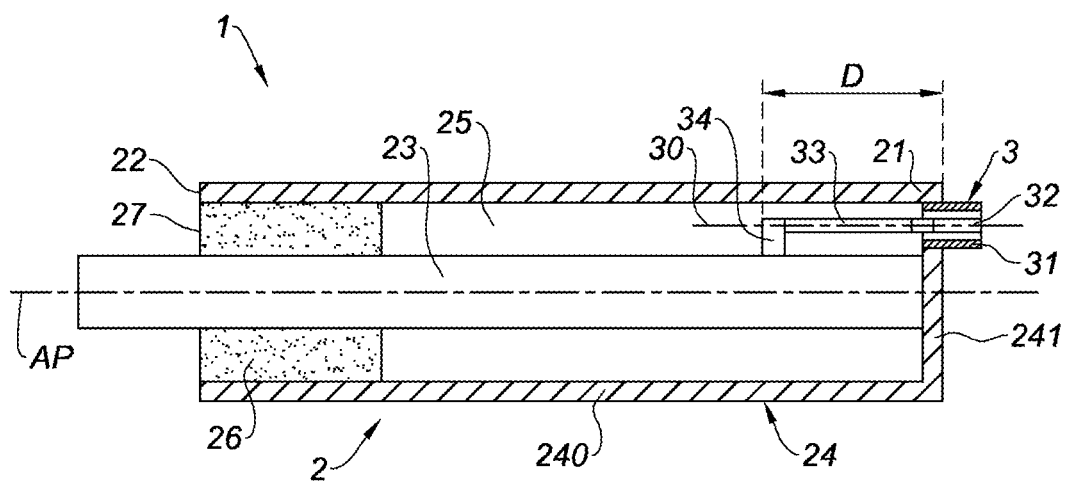
FIG. 2 is an axial cross-sectional schematic view of a first elementary device in accordance with the present disclosure.

In the first and third forms of FIGS. 2 and 6, the connecting member 34 is fastened to the free end of the connecting element 33 by welding.

Figure 3:
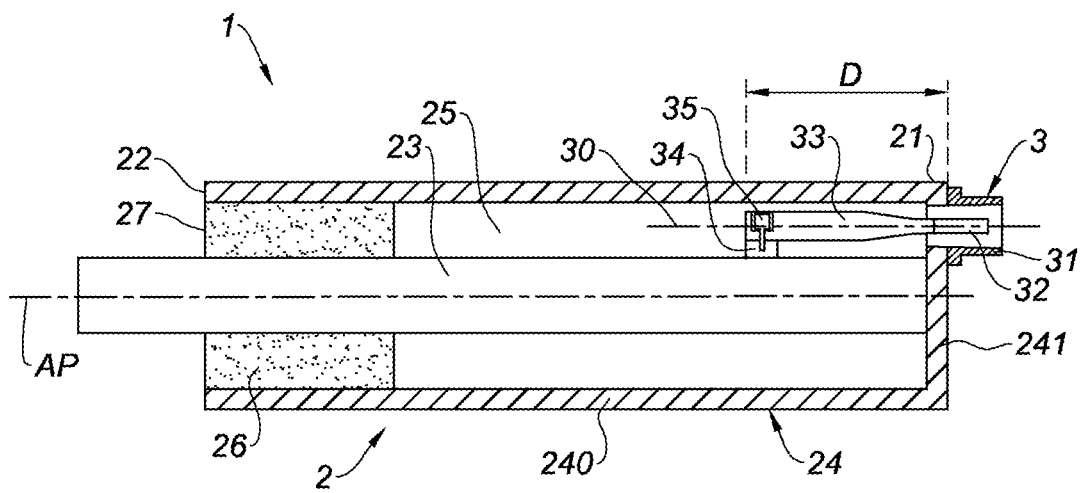
FIG. 3 is an axial cross-sectional schematic view of a second elementary device in accordance with the present disclosure.
Figure 4:
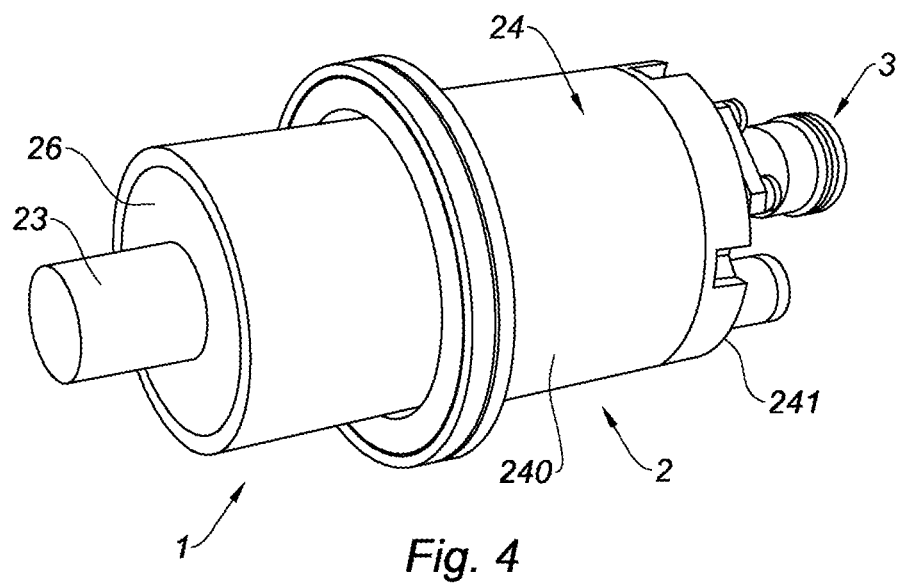
FIG. 4 is a schematic perspective view of the first or second elementary devices in accordance with the present disclosure.

In the second form of FIG. 3, the connecting member 34 is fastened to the free end of the connecting element 33 by way of a screw 35.

In a non-shown variant, the connecting member 34 is fastened to the free end of the connecting element 33 by crimping.

In the first and third forms of FIGS. 2 and 6, the connecting element 33 has the shape of a cylindrical stem of constant diameter.

In the second form of FIG. 3, the connecting element 33 has successively: a cylindrical initial portion of reduced diameter connected to the inner conductor 32 of the coaxial structure connector 3; an intermediate truncated-cone-shaped portion; and a cylindrical final portion of increased diameter (in other words of a diameter greater than that of the initial portion) which ends with the free end carrying the connecting member 34 connected to the central core 23.

Such an elementary device 1 is used in a microwave treatment installation of a load, and in particular, in a plasma production installation comprising: the chamber 4 in the volume of which the load is confined, the chamber 4 being delimited by a partition 40 (as seen in FIGS. 5 and 8); at least one microwave energy generator (not illustrated), in particular of the solid-state generator type; at least one coaxial cable or guide 5 (seen in FIG. 9) connected on the one hand to the generator and on the other hand to the coaxial structure connector 3 of an elementary device 1; and at least one elementary device 1 emerging inside the chamber 4, through the partition, as seen in FIGS. 5 and 8.

It should be noted that the shield 24 of the coaxial applicator 2: is either constituted of a part attached to the chamber 4 and passing tightly through its partition 40; or is integrally formed at least partially with the partition 40, or in other words the shield 24 is formed partially or fully by the partition 40 itself.

The description of the disclosure is merely exemplary in nature and, thus, variations that do not depart from the substance of the disclosure are intended to be within the scope of the disclosure. Such variations are not to be regarded as a departure from the spirit and scope of the disclosure.

What is claimed is:

1. An elementary device for applying a microwave energy, the elementary device comprising:
   a microwave power coaxial applicator having a distal end and a proximal end opposite to the distal end and configured to extend inside a chamber, wherein the microwave power coaxial applicator comprises:
   a coaxial structure connector disposed at the distal end to couple to a coaxial cable or a guide connected to a microwave energy generator;
   a conductive central core extending along a main axis;
   an outer conductive shield having a peripheral wall surrounding the central core, and a bottom wall provided at the distal end and extending transversely relative to the main axis,
   a medium for propagating the microwave energy located between the central core and the shield, and
   an insulating body made of dielectric material transparent to the microwave energy and disposed at the proximal end, wherein:
   the coaxial structure connector is provided with an outer conductor connected to the shield and surrounding an inner conductor connected to the central core, and the coaxial structure connector is disposed at the bottom wall of the shield having the outer conductor fastened to the bottom wall and the inner conductor connected to an elongate connecting element, the elongate connecting element passes through the bottom wall and extends from the bottom wall substantially parallel to the main axis with a predefined space provided between the central core and a free end of the elongate connecting element, the elongate connecting element is connected to the central core at a predefined distance from the bottom wall.

2. The elementary device according to claim 1, wherein the central core is configured to support a connecting member that is in contact with the free end of the connecting element at the predefined distance from the bottom wall.

3. The elementary device according to claim 2, wherein the connecting member is fastened to the free end of the connecting element by at least one of a screw, a weld, or a crimp.

4. The elementary device according to claim 2, wherein the connecting member is welded to the central core.

5. The elementary device according to claim 1, wherein the connecting element has:
an initial cylindrical portion of reduced diameter connected to the inner conductor of the coaxial structure connector;
an intermediate truncated-cone-shaped portion; and
a final cylindrical portion of increased diameter that ends with the free end connected to the central core.

6. The elementary device according to claim 1, wherein the elementary device constitutes an elementary device for producing a plasma inside the chamber.

7. A microwave treatment installation of a load, the microwave treatment installation comprising:
a chamber in the volume of which the load is confined;
at least one microwave energy generator;
at least one elementary device in accordance with claim 1, wherein the coaxial structure connector of the at least one elementary device is connected to a coaxial cable or guide connected to the microwave energy generator and the proximal end of the coaxial applicator is configured to extend inside the chamber.

* * * * *